(12) United States Patent
Park et al.

(10) Patent No.: US 9,259,895 B2
(45) Date of Patent: Feb. 16, 2016

(54) FLEXIBLE SUBSTRATE AND METHOD OF MANUFACTURING THE SAME

(71) Applicant: LG Display Co., Ltd., Seoul (KR)

(72) Inventors: JaeHee Park, Gumi-si (KR); Binn Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/573,633

(22) Filed: Dec. 17, 2014

(65) Prior Publication Data

US 2015/0183180 A1 Jul. 2, 2015

(30) Foreign Application Priority Data

Dec. 26, 2013 (KR) .......................... 10-2013-0164538

(51) Int. Cl.
*H01L 29/04* (2006.01)
*B32B 3/10* (2006.01)
*B32B 9/04* (2006.01)

(52) U.S. Cl.
CPC ... *B32B 3/10* (2013.01); *B32B 9/04* (2013.01); *B32B 2457/20* (2013.01); *Y10T 428/24339* (2015.01); *Y10T 428/24851* (2015.01)

(58) Field of Classification Search
CPC ....... H01L 27/12; H01L 27/1218; B32B 3/10; B32B 2457/20
USPC ............................... 257/59, 72, 431
See application file for complete search history.

(56) References Cited

U.S. PATENT DOCUMENTS

2010/0151209 A1* 6/2010 Wei et al. ................... 428/189

* cited by examiner

*Primary Examiner* — Tu-Tu Ho
(74) *Attorney, Agent, or Firm* — Fenwick & West LLP

(57) ABSTRACT

A flexible substrate and corresponding method of manufacturing are described. The flexible substrate includes a substrate, a first buffer layer, a second buffer layer and a third buffer layer. The first buffer layer, positioned on the substrate, has a plurality of first buffer segments. The second buffer layer, positioned on the first buffer layer, has a plurality of second buffer segments. The third buffer layer, positioned on the second buffer layer, is connected to the first buffer layer via a contact hole between two adjacent second buffer segments. Because the first buffer layer is patterned to include buffer segments, cracking in the first buffer layer is reduced. Because the third buffer layer is connected to segments of the first buffer layer via a contact hole between two adjacent second buffer segments, moisture permeation paths from the substrate into the second buffer layer are blocked, suppressing moisture permeation.

9 Claims, 9 Drawing Sheets

FLEXIBLE SUBSTRATE AND METHOD OF MANUFACTURING THE SAME

CROSS-REFERENCE TO RELATED APPLICATIONS

This application claims the priority of Korean Patent Application No. 10-2013-0164538 filed on Dec. 26, 2013 in the Korean Intellectual Property Office, the disclosure of which is incorporated herein by reference.

BACKGROUND

1. Technical Field

The present disclosure relates to a flexible substrate and a method of manufacturing the same. More particularly, the present disclosure relates to a flexible substrate of a structure to achieve both of minimized crack occurrence therein and oxygen and moisture permeation thereto, and a method of manufacturing the same.

2. Description of the Related Art

Elements such as thin-film transistor used in display devices such as Organic Light Emitting Displays (OLEDs), Liquid Crystal Displays (LCDs) and Electro Phoretic Displays (EPDs) may deteriorate due to oxygen and moisture permeation.

Incidentally, flexible display devices have been recently gaining attention as display devices for the next generation. These flexible display devices are fabricated by forming display units and traces on flexible substrates such as plastic so that they are able to display images even when they are bent like paper. Accordingly, efforts are being made to implement display devices such as OLEDs, LCDs and EPDs into flexible display devices.

SUMMARY

In order to prevent elements such as thin-film transistors used in a flexible display device from deteriorating due to oxygen or moisture permeation, buffer layers that have silicon nitride ($SiN_x$) layers and silicon oxide ($SiO_x$) layers stacked on one another alternately have been introduced. However, the silicon nitride layers are less flexible than the silicon oxide layers and thus cracks are likely to occur in the silicon nitride layers. Further, the silicon oxide layers are more vulnerable to oxygen and moisture permeation than the silicon nitride layers. When a crack occurs in a silicon nitride layer with low flexibility, oxygen permeation paths and moisture permeation paths via the crack in the silicon nitride layer and a silicon oxide layer are created. As a result, the performance of the buffer layers to suppress oxygen and moisture permeation may deteriorate. Moreover, when a crack occurs in the multiple buffer layers, the crack may reach an insulation layer on the multiple buffer layers or on a metal material such as a trace. This may result in operation failure of the flexible display device. In view of the above, the inventors of this application have developed a flexible substrate that reduces cracks and suppresses oxygen and moisture permeation in buffer layers employed in the flexible display device, as well as a method of manufacturing the same.

The objects of the present disclosure are not limited to the aforementioned objects, and other objects which are not mentioned above, will be apparent to those skilled in the art from the following description.

According to an exemplary embodiment of the present disclosure, there is provided a flexible substrate including a substrate, a first buffer layer, a second buffer layer and a third buffer layer. The first buffer layer is positioned on the substrate. The first buffer layer has a plurality of first buffer segments. The second buffer layer is positioned on the first buffer layer. The second buffer layer has a plurality of second buffer segments. The third buffer layer is positioned on the second buffer layer. The third buffer layer is connected to the first buffer layer via a contact hole between two adjacent second buffer segments. As the first buffer layer is patterned to include the plurality of buffer segments, cracks occurring in the first buffer layer can be reduced. In addition, as the third buffer layer is connected to the plurality of segments of the first buffer layer via a contact hole between two adjacent second buffer segments, moisture permeation paths from the substrate into the second buffer layer are blocked. As a result, moisture permeation via the second buffer layer can be suppressed.

In some embodiments, the third buffer layer has a plurality of third buffer segments spaced apart from one another.

In some embodiments, each of the second buffer segments is isolated by the contact of the first buffer segment and third buffer segment connected via the contact hole between each of the second buffer segments.

In some embodiments, the flexible substrate further includes a continuous fourth buffer layer covering the plurality of third buffer segments, the fourth buffer layer being formed from materials used to form the second buffer layer and connected to the second buffer layer via a contact hole between two adjacent third buffer segments.

In some embodiments, the fourth buffer layer and the second buffer layer are a silicon oxide ($SiO_x$) layer.

In some embodiments, the flexible substrate further includes a lower buffer layer interposed between the substrate and the first buffer layer, wherein the lower buffer layer is formed of the same materials used to form the second buffer layer.

In some embodiments, a material of the first buffer layer and a material of the third buffer layer are the same, and a material of the second buffer layer is different from the material of the first and third buffer layers.

In some embodiments, the first buffer layer and the third buffer layer are silicon nitride ($SiN_x$) layers, and the second buffer layer is silicon oxide ($SiO_x$) layer.

According to an exemplary embodiment of the present disclosure, there is provided a flexible substrate including a substrate, a plurality of first buffer layers and a plurality of second buffer layers. The first buffer layer is positioned on the substrate. The second buffer is positioned on the substrate. Each of the second buffer layers are interposed between two adjacent first buffer layers. At least one of the first buffer layers is patterned to have a plurality of buffer segments, and at least one of the buffer segments in one of the first buffer layers is connected to the plurality of the buffer segments in the adjacent first buffer layer. At least one layer of the first buffer is patterned to reduce crack occurrence in the first buffer layer. Consequently, moisture possibly permeating via the substrate and the second buffer can be suppressed.

In some embodiments, each of the first buffer layers is a silicon nitride ($SiN_x$) layer, and each of the second buffer layers is a silicon oxide ($SiO_x$) layer.

In some embodiments, at least one of the second buffer layers is patterned to have plurality of buffer segments, which are connected to the adjacent second buffer layer.

In some embodiments, the plurality of buffer segments in one of the second buffer layers includes a first group of buffer segments connected to the adjacent second buffer layer positioned above the respective buffer segments and a second group of buffer segments connected to the adjacent second buffer layer positioned below the respective buffer segments.

Particulars of various exemplary embodiments of the present disclosure are included in the detailed description and in the accompanying drawings.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
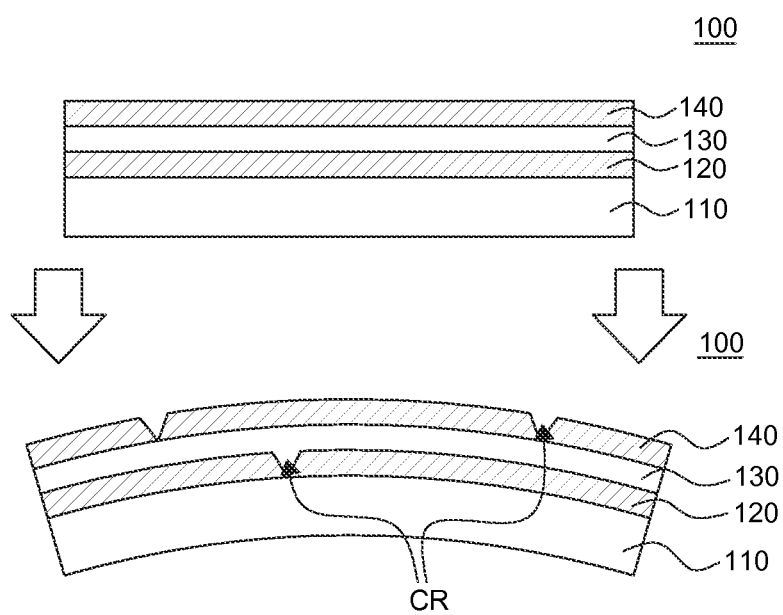
FIG. 1 is a pair of simplified cross-sectional views, one for illustrating a flexible substrate having multiple buffer layers, and the other for illustrating the flexible substrate when it is bent.

Various advantages and features of the present disclosure and methods accomplishing thereof will become apparent from the following description of embodiments with reference to the accompanying drawings. However, the present disclosure is not limited to exemplary embodiment disclosed herein but will be implemented in various forms. The exemplary embodiments are provided byway of example only so that a person of ordinary skill in the art can fully understand the disclosures and the scope of the present disclosure. Therefore, the present disclosure will be defined only by the scope of the appended claims.

Indicating that elements or layers are "on" other elements or layers includes both a case in which the corresponding elements are just above other elements and a case in which the corresponding elements are intervened with other layers or elements.

Although first, second, and the like are used in order to describe various components, the components are not limited by the terms. The above terms are used only to discriminate one component from the other. Therefore, the first component mentioned below may be a second component within the technical spirit of the present disclosure.

The reference numerals used to indicate the elements are constant throughout the specification In the drawings, size and thickness of each element are arbitrarily illustrated for convenience of description and the present disclosure is not necessarily limited to those illustrated in the drawings.

The components of various embodiments of the present disclosure can be partially or entirely bonded to or combined with each other. They can be interlocked and operated in technically various ways as can be fully understood by an ordinary person skilled in the art, and the embodiments can be carried out independently of or in association with each other.

Hereinafter, various embodiments of the present disclosure will be described in detail with reference to the accompanying drawings.

FIG. 1 is a pair of simplified cross-sectional views, one for illustrating a flexible substrate 100 having multiple buffer layers and the other for illustrating the flexible substrate 100 when it is bent. Referring to FIG. 1, the flexible substrate 100 includes a substrate 110, silicon nitride layers 120 and 140, and a silicon oxide layer 130. The silicon nitride layers 120 and 140 and the silicon oxide layer 130 are alternately stacked on one another so that they form multiple buffer layers to suppress oxygen and moisture permeation from the outside.

Specifically, the silicon nitride layer 120 is formed on the substrate 110. The silicon oxide layer 130 is formed on the silicon nitride layer 120. The silicon nitride layer 140 is formed on the silicon oxide layer 130. As can be seen from FIG. 1, when the substrate 110 is bent, cracks CR may occur first in the silicon nitride layers 120 and 140 because the silicon nitride layers 120 and 140 are less flexible than the silicon oxide layer 130. When cracks CR occur in the silicon nitride layers 120 and 140, paths in which oxygen and moisture permeate through are created from the silicon nitride layers 120 and 140 to the silicon oxide layer 130 which is more vulnerable to oxygen and moisture permeation than the silicon nitride layers 120 and 140. Consequently, the performance of the multiple buffer layers to suppress oxygen and moisture permeation deteriorates.

Figure 2:
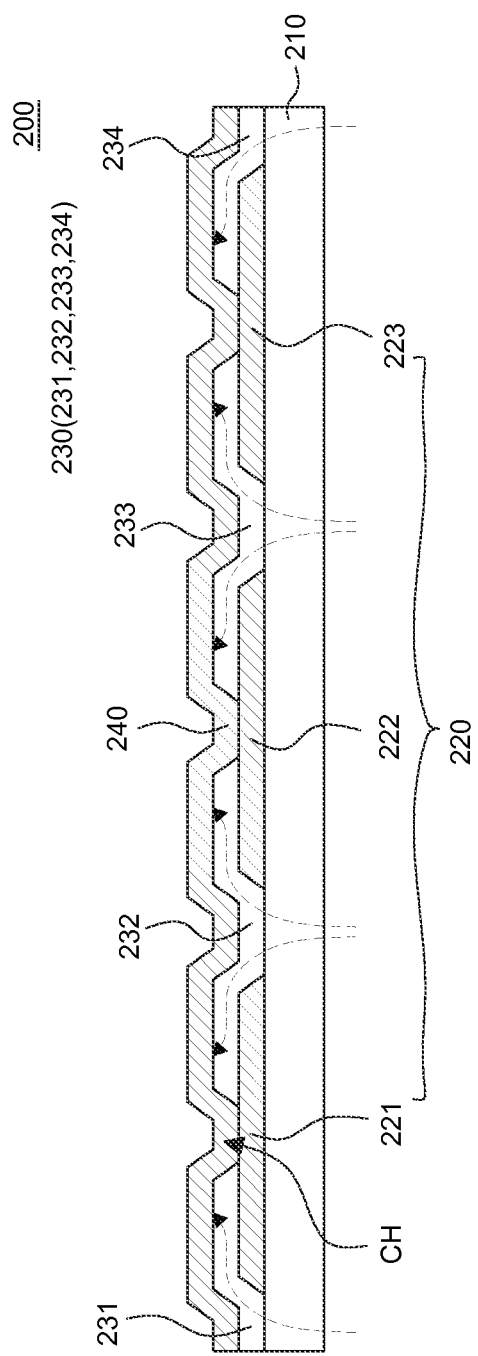
FIG. 2 is a cross-sectional view for illustrating shapes of the first and second buffers of a flexible substrate according to an exemplary embodiment of the present disclosure.

FIG. 2 is a cross-sectional view for illustrating shapes of the first buffer layers and a second buffer layer of a flexible substrate according to an exemplary embodiment of the present disclosure. Referring to FIG. 2, a flexible substrate 200 includes a substrate 210, the first buffer layers 220 and 240 and a second buffer layer 230.

The first buffer layers 220 and 240 and the second buffer layer 230 are made of materials to suppress oxygen and moisture permeation from the outside. The material of the first buffer layers 220 and 240 is different from that of the second buffer layer 230. Specifically, the first buffer layers 220 and 240 may be made of silicon nitride ($SiN_x$), silicon oxynitride ($SiO_xN_y$), aluminum oxide ($AlO_x$) or the like. The second buffer layer 230 may be made of silicon oxide ($SiO_x$) or the like. Accordingly, the second buffer layer 230 is more flexible than the first buffer layers 220 and 240.

The first buffer layers 220 and 240 include a first layer 220 formed on the substrate 210 and a second layer 240 formed above the first layer 220. When the substrate 210 is bent, cracks are more likely to occur in the first buffer layers 220 and 240 than in the second buffer layer 230 since the first buffer layers 220 and 240 are less flexible than the second buffer layer 230. In particular, the possibility of occurrence of cracks in the first buffer layers 220 and 240 increases as the length of the first buffer layers 220 and 240 increases in the bending direction. In order to alleviate the above problem, the first layer 220 that constitutes the first buffer layers 220 and 240 of the flexible substrate 200 includes a plurality of buffer segments 221, 222 and 223. By doing so, the length of the first segmented layer 220 that extends in the bending direction of the substrate 210 can be shortened. Thus, the length of the first segmented layer 220 bending in the direction of substrate 210 is comparatively shorter than that of the single continuous layer 220 which ultimately allows the cracks occurring in the layer 220 to be suppressed.

The second buffer layer 230 is formed between the first layer 220 and the second layer 240 of the first buffer layers 220 and 240. As mentioned earlier, oxygen and moisture more easily permeate into the second buffer layer 230 than into the first buffer layers 220 and 240. In view of this, according to an exemplary embodiment of the present disclosure, the first layer 220 and the second layer 240 of the first buffer layers 220 and 240 of the flexible substrate 200 are connected to each other in order to block oxygen and moisture permeation paths via the second buffer layer 230. The second buffer layer 230 includes contact holes CH formed therein with each formed on each of the plurality of buffer segments 221, 222 and 223 of the first layer 220. The contact holes CH of the second buffer layer 230 are respectively interposed between buffer segments 231, 232, 233 and 234 of the second buffer layer 230. Thus, the first layer 220 and the second layer 240 of the first buffer layers 220 and 240 are connected to each other via the contact holes CH. Accordingly, as indicated by the arrows in FIG. 2, the oxygen and moisture permeation paths from the substrate 210 into the second buffer layer 230 are blocked by the second layer 240 of the first buffer layers 220 and 240. Since the oxygen and moisture permeation paths from the substrate 210 into the second buffer layer 230 are blocked in the flexible substrate 200 according to the exemplary embodiment of the present disclosure, oxygen and moisture permeation via the flexible substrate 200 can be suppressed.

Although the first buffer layers 220 and 240 illustrated in FIG. 2 include two layers, the first buffer layers may include more than two layers. When the first buffer layers include more than two layers, the second buffer layer is formed between every two adjacent layers among the first buffer layers. The second buffer layer has contact holes CH that need to be connected to two adjacent layers of the first buffer layers, thereby blocking oxygen and moisture permeation paths via the second buffer layer. In addition, the layers of the first buffer layers may be patterned to include a plurality of buffer segments. In this case, each of the first buffer layers has contact holes CH to connect two adjacent second buffer layers. Therefore, one of the second buffer layers is connected to the adjacent second buffer layer positioned above or below the second buffer layer. In other words, a first group of buffer segments of the second buffer layer is connected to the adjacent second buffer layer positioned above the respective buffer segments and a second group of buffer segments of the second buffer layer is connected to the adjacent second buffer layer positioned below the respective buffer segments.

Figure 3A:
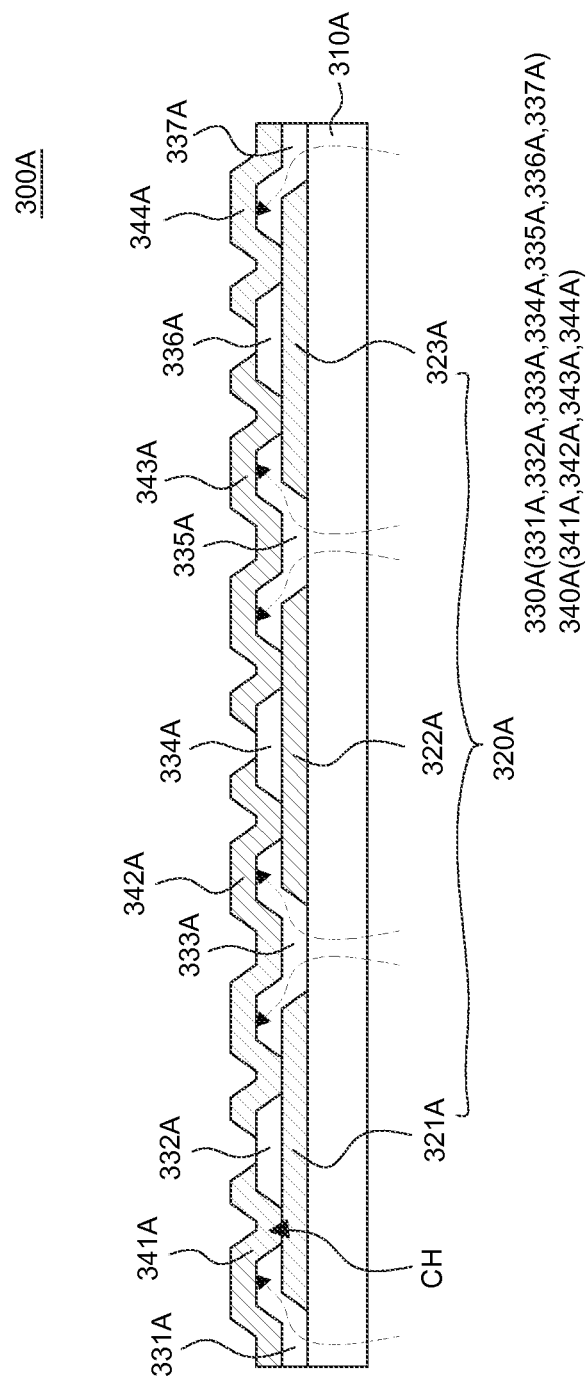
FIG. 3A is a cross-sectional view for illustrating shapes of the first, second and third buffer layers of a flexible substrate according to an exemplary embodiment of the present disclosure.

FIG. 3A is a cross-sectional view for illustrating shapes of first, second and third buffer layers of a flexible substrate according to an exemplary embodiment of the present disclosure. Referring to FIG. 3A, a flexible substrate 300A includes a substrate 310A, a first buffer layer 320A, a second buffer layer 330A, and a third buffer layer 340A. The substrate 310A of the flexible substrate 300A illustrated in FIG. 3A is substantially identical to the substrate 210 illustrated in FIG. 2 and thus a redundant description will not be made.

The first buffer layer 320A is formed on the substrate 310A and may be made of silicon nitride, silicon oxynitride and aluminum oxide or the like. Like the first layer 220 of the first buffer layers 220 and 240 illustrated in FIG. 2, the first buffer layer 320A is patterned to include a plurality of buffer segments 321A, 322A and 323A.

The second buffer layer 330A is formed on the first buffer layer 320A and is made of a material different from that of the first buffer layer 320A. The second buffer layer 330A may be made of silicon oxide or the like. The second buffer layer 330A includes contact holes CH, two on each of the plurality of buffer segments 321A, 322A and 323A of the first buffer layer 320A. Each of the contact holes CH of the second buffer layer 330A is formed between two adjacent buffer segments among the plurality of buffer segments 331A, 332A, 333A, 334A, 335A, 336A and 337A of the second buffer layer 330A.

The third buffer layer 340A is formed on the second buffer layer 330A and is made of a material different from that of the second buffer layer 330A. The third buffer layer 340A may be made of silicon nitride, silicon oxynitride, aluminum oxide or the like and may be made of the same material as that of the first buffer layer 320A. The third buffer layer 340A is patterned to include a plurality of buffer segments 341A, 342A, 343A and 344A which are spaced apart from one another above the plurality of buffer segments 321A, 322A and 323A of the first buffer layer 320A. In the flexible substrate 300A according to the exemplary embodiment of the present disclosure, the length of the third buffer layer 340A extending in the bending direction of the substrate 310A, as well as the length of the first buffer layer 320A, are shortened. Therefore, cracks occurring in the third buffer layer 340A can be suppressed.

The buffer segments 341A, 342A, 343A and 344A of the third buffer layer 340A are connected to the buffer segments 321A, 322A and 323A of the first buffer layer 320A via the contact holes CH of the second buffer layer 330A. As such, in the flexible substrate 300A according to the exemplary embodiment of the present disclosure, the first buffer layer 320A and the third buffer layer 340A are connected to each other via the contact holes CH of the second buffer layer 330A. Accordingly, as indicated by the arrows in FIG. 3A, the oxygen and moisture permeation paths from the substrate 310A into the second buffer layer 330A can be blocked by the third buffer layer 340A. Since the oxygen and moisture permeation paths from the substrate 310A into the second buffer layer 330A are blocked in the flexible substrate 300A according to the exemplary embodiment of the present disclosure, oxygen and moisture permeation via the flexible substrate 300A can be suppressed.

Figure 3B:
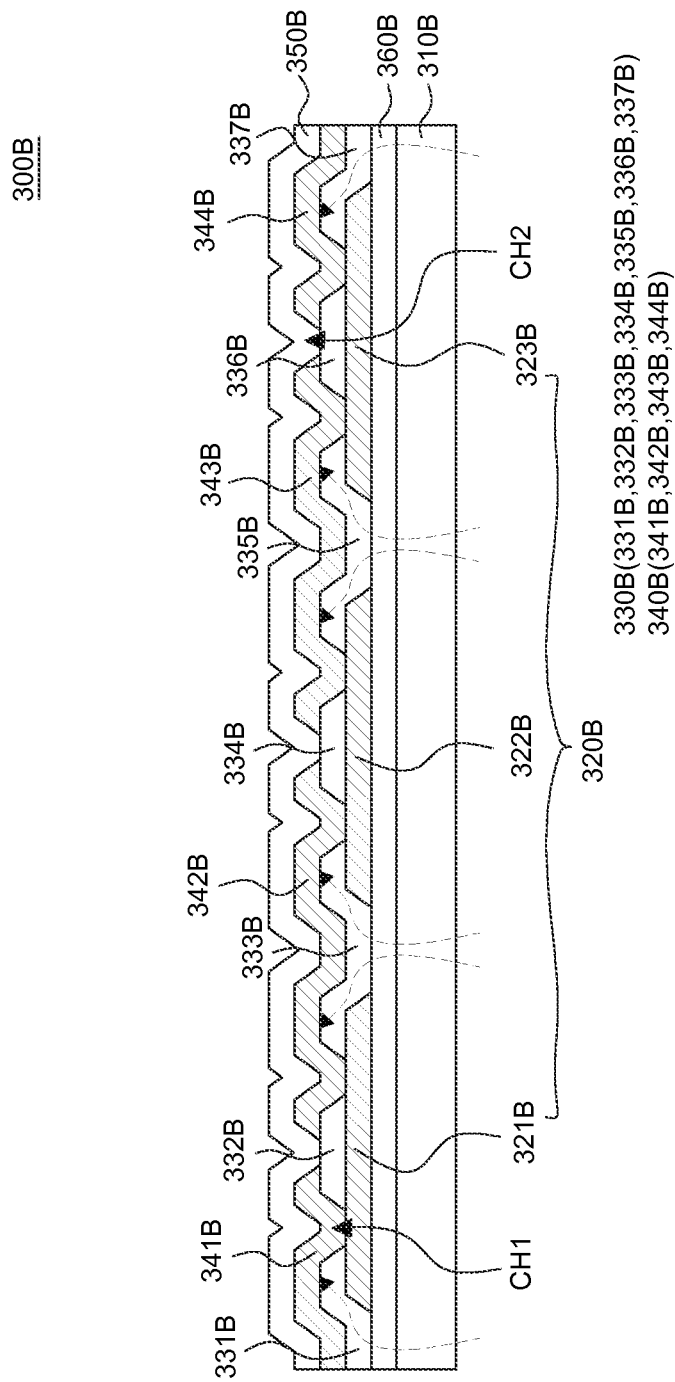
FIG. 3B is a cross-sectional view for illustrating lower and fourth buffer layers of a flexible substrate according to an exemplary embodiment of the present disclosure.

FIG. 3B is a cross-sectional view for illustrating a lower buffer layer and a fourth buffer layer of a flexible substrate according to an exemplary embodiment of the present disclosure. Referring to FIG. 3B, a flexible substrate 300B includes a substrate 310B, a first buffer layer 320B, a second buffer layer 330B, a third buffer layer 340B, a fourth buffer layer 350B and a lower buffer layer 360B. The flexible substrate 300B illustrated in FIG. 3B is substantially identical to the flexible substrate 300A illustrated in FIG. 3A except that the former further includes the fourth buffer layer 350B and the lower buffer layer 360B.

The fourth buffer layer 350B is formed on the third buffer layer 340B and is made of a material different from that of the third buffer layer 340B. The fourth buffer layer 350B may be made of silicon oxide or the like and may be made of the same material as that of the second buffer layer 330B. The fourth buffer layer 350B is connected to the second buffer layer 330B via contact holes CH2 between two adjacent segments among a plurality of buffer segments 341B, 342B, 343B and 344B of the third buffer layer 340B. The fourth buffer layer 350B is connected to the plurality of buffer segments 332B, 334B and 336B of the second buffer layer 330B and is formed between two adjacent segments among the plurality of buffer segments 341B, 342B, 343B and 344B of the third buffer layer 340B. In the flexible substrate 330B according to the exemplary embodiment of the present disclosure, when the substrate 310B is bent, the resulting stress can be dispersed via the second buffer layer 330B and the fourth buffer layer 350B connected to each other. Therefore, cracks are less likely to occur in the third buffer layer 340B.

The lower buffer layer 360B is interposed between the substrate 310B and the first buffer layer 320B. The lower buffer layer 360B is connected to the second buffer layer 330B via contact holes CH1 between two adjacent segments among the plurality of buffer segments 321B, 322B and 323B of the first buffer layer 320B. The lower buffer layer 360B is made of a material different from that of the first buffer layer 320B. The lower buffer layer 360B may be made of silicon oxide or the like and may be made of the same material as the second buffer layer 330B. Accordingly, the lower buffer layer 360B is more flexible than the first buffer layer 320B. In the flexible substrate 330B according to the exemplary embodiment of the present disclosure, when the substrate 310B is bent, the resulting stress is first delivered to the lower buffer layer 360B which is more flexible than the first buffer layer 320B. Then, the resulting stress can be dispersed from the lower buffer layer 360B to the second buffer layer 330B. Therefore, cracks are less likely to occur in the first buffer layer 320B.

Figure 3C:
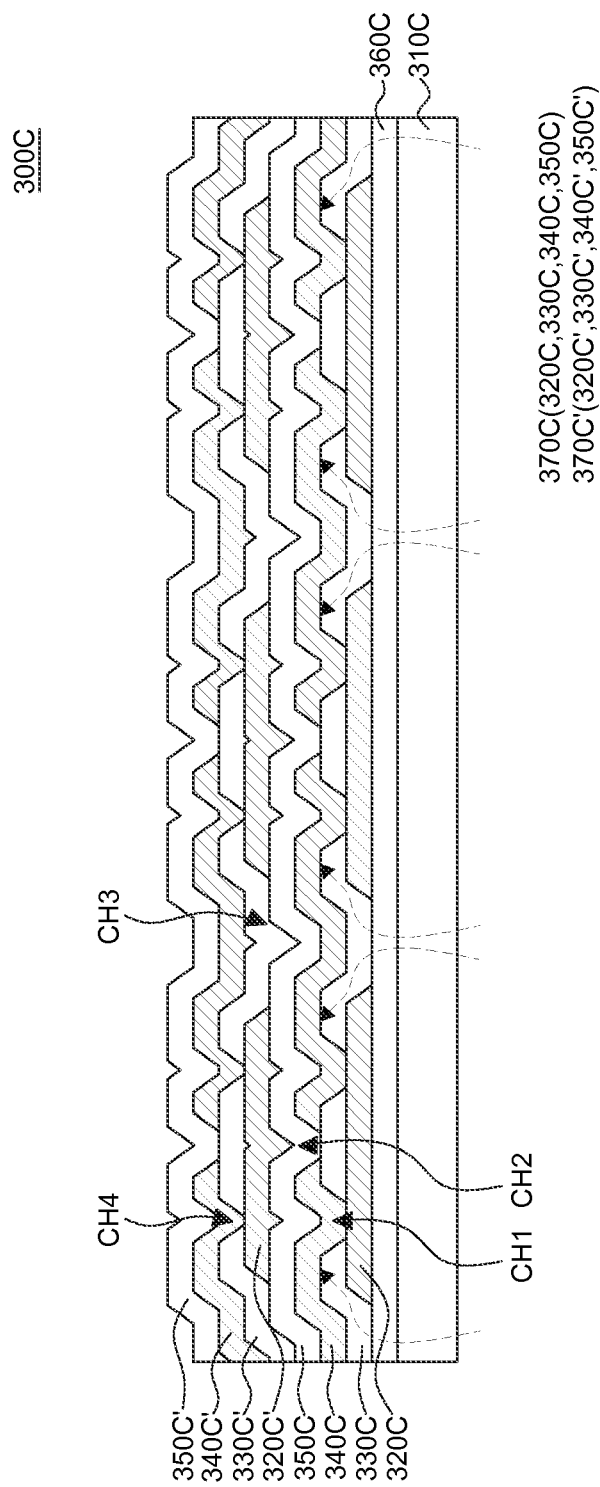
FIG. 3C is a cross-sectional view for illustrating a plurality of sets of buffer layers of a flexible substrate according to an exemplary embodiment of the present disclosure.

According to an exemplary embodiment of the present disclosure, FIG. 3C is a cross-sectional view for illustrating a plurality of sets of buffer layers of a flexible substrate. Referring to FIG. 3C, a flexible substrate 300C includes a substrate 310C, a first set of buffer layers 370C, a second set of buffer layers 370C' and a lower buffer layer 360C. The first set of buffer layers 370C includes a first buffer layer 320C, a second buffer layer 330C, a third buffer layer 340C and a fourth buffer layer 350C. The second set of buffer layers 370C' includes a fifth buffer layer 320C', a sixth buffer layer 330C', a seventh buffer layer 340C' and an eighth buffer layer 350C'. The flexible substrate 300C illustrated in FIG. 3C is substantially identical to the flexible substrate 300B illustrated in FIG. 3B except that the former further includes the second set of buffer layers 370C'.

The second set of buffer layers 370C' is formed on the first set of buffer layers 370C. Specifically, the fifth buffer layer 320C' is formed on the fourth buffer layer 350C, the sixth buffer layer 330C' is formed on the fifth buffer layer 320C', the seventh buffer layer 340C' is formed on the sixth buffer layer 330C', and the eighth buffer layer 350C' is formed on the seventh buffer layer 340C'. The second set of buffer layers 370C' is formed in the same manner as the first set of buffer layers 370C, so those cracks occurring in the second set of buffer layers 370C' are suppressed. The first and second sets of buffer layers 370C are made of materials to suppress oxygen and moisture permeation from the outside. Therefore, by using the plurality of sets of buffer layers 370C and 370C', oxygen and moisture permeation from the outside can be more suppressed. In addition, in the flexible substrate 300C according to the exemplary embodiment of the present disclosure, buffer layers constituting the plurality of sets of buffer layers 370C and 370C' are patterned to include a plurality of buffer segments. Therefore, cracks occurring in the plurality of sets of buffer layers 370C and 370C' can be suppressed likewise even if the overall thickness of the buffer layers 360C, 370C and 370C' is increased.

Additionally, as illustrated in FIG. 3C, the lower buffer layer 360C is connected to the second buffer layer 330C, the second buffer layer 330C is connected to the fourth buffer layer 350C, the fourth buffer layer 350C is connected to the sixth buffer layer 330C', and the sixth buffer layer 330C' is connected to the eighth buffer layer 350C'. Therefore, when the substrate 310C is bent, the resulting stress can be dispersed among the lower buffer layer 360C, the second buffer layer 330C, the fourth buffer layer 350C, the sixth buffer layer 330C' and the eighth buffer layer 350C'. Consequently, cracks occurring in the first buffer layer 320C, the third buffer layer 340C, the fifth buffer layer 320C' and the seventh buffer layer 340C' can be suppressed.

Although the fourth buffer layer 350C illustrated in FIG. 3C does not include contact holes, the fourth buffer layer 350C may be formed to include contact holes to connect the third buffer layer 340C to the fifth buffer layer 320C'.

In FIG. 3C, the third buffer layer 340C and the seventh buffer layer 340C' are patterned to include pluralities of buffer segments. However, the third buffer layer 340C and the seventh buffer layer 340C' may not include the pluralities of buffer segments. Instead, like the third buffer layer 240 illustrated in FIG. 2, the third buffer layer 340C may be connected to the plurality of buffer segments of the first buffer layer 320C via the contact holes CH1 of the second buffer layers 330C to block the oxygen and moisture permeation paths via the second buffer layer 330C. In addition, the seventh buffer layer 340C' may be connected to the plurality of buffer segments of the fifth buffer layer 320C' via the contact holes CH4 of the sixth buffer layers 330C' to block the oxygen and moisture permeation paths via the sixth buffer layer 330C'. In this instance, the second buffer layer 330C may include contact holes CH1 with one on each of the plurality of buffer segments of the first buffer layer 320C. Further, the sixth buffer layer 330C' may include contact holes CH4, one on each of the plurality of buffer segments of the fifth buffer layer 320C'.

Figure 4:
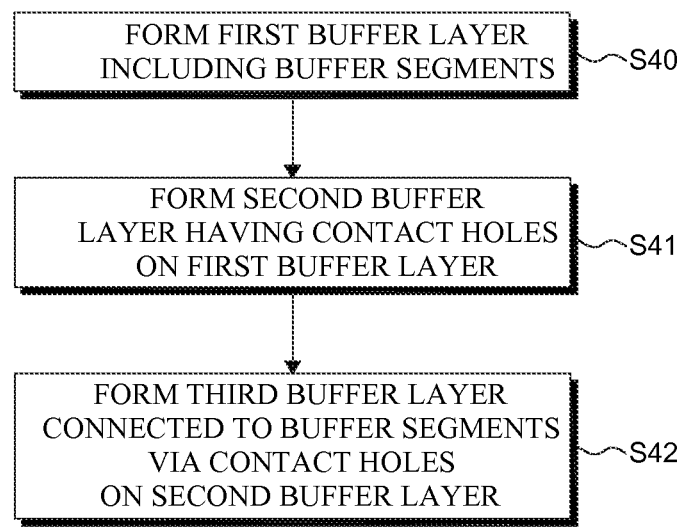
FIG. 4 is a flowchart for illustrating a method of manufacturing a flexible substrate according to an exemplary embodiment of the present disclosure.
Figure 5A:
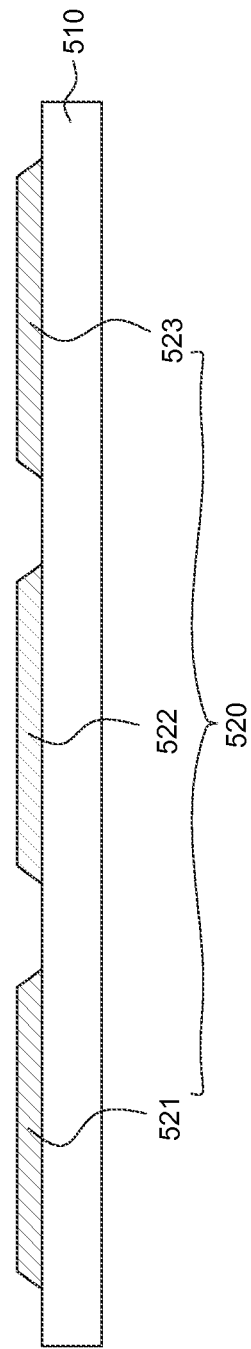
FIGS. 5A to 5C are cross-sectional views for illustrating processes of manufacturing a flexible substrate according to an exemplary embodiment of the present disclosure.
Figure 5B:
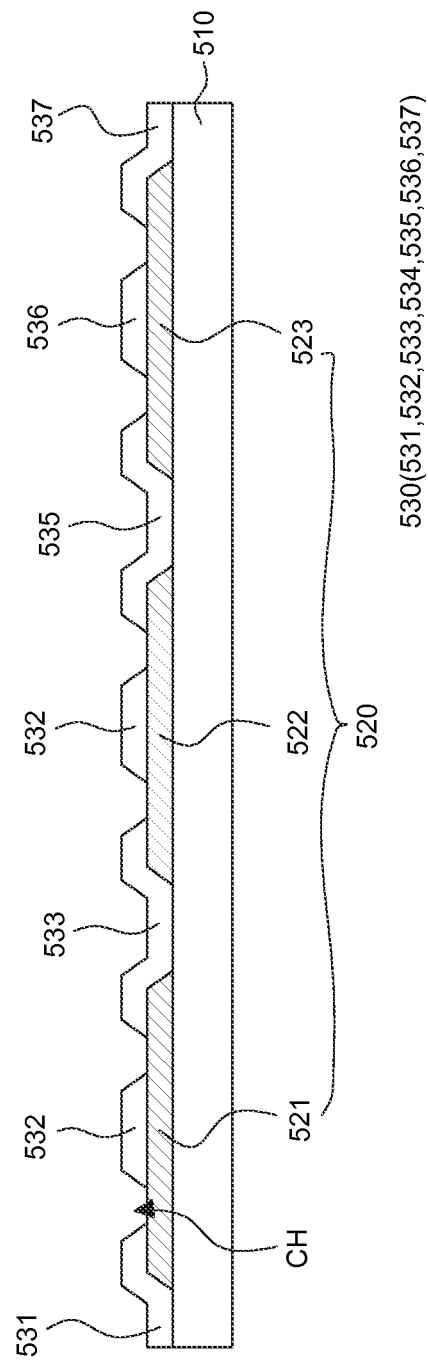
Figure 5C:
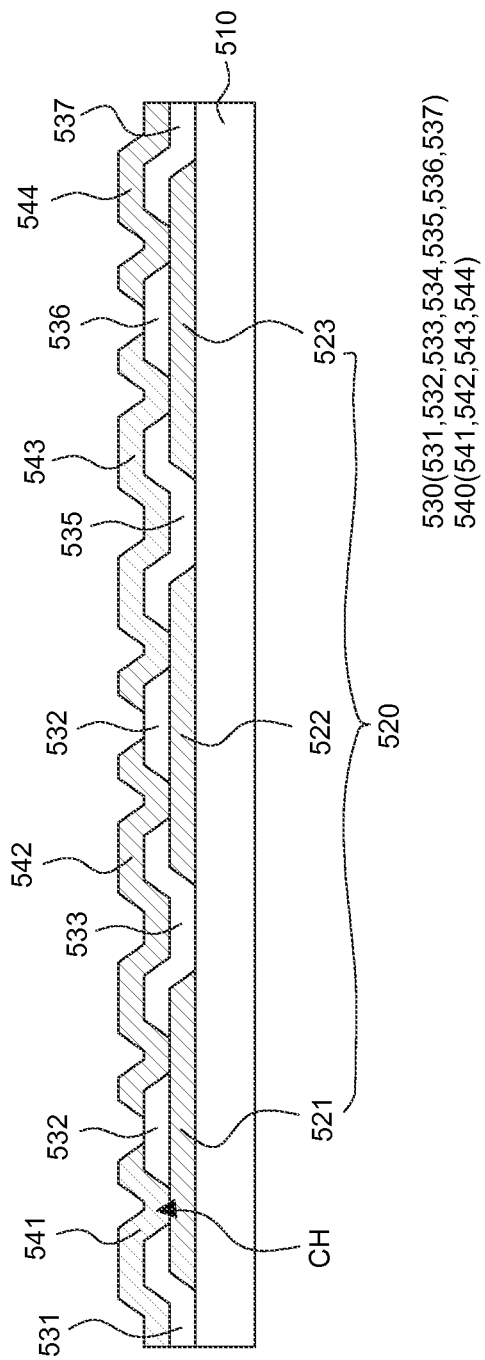

FIG. 4 is a flowchart for illustrating a method of manufacturing a flexible substrate according to an exemplary embodiment of the present disclosure. FIGS. 5A to 5C are cross-sectional views for illustrating processes of manufacturing a flexible substrate according to an exemplary embodiment of the present disclosure.

Initially, a first buffer layer including buffer segments is formed on a substrate (S40). Reference is made to FIG. 5A in order to describe the forming of the first buffer layer including the buffer segments on the substrate.

As illustrated in FIG. 5A, after the first buffer layer 520 is formed on the substrate 510, the first buffer layer 520 is patterned to include a plurality of buffer segments 521, 522 and 523.

Then, a second buffer layer including contact holes is formed on the first buffer layer (S41). Reference is made to FIG. 5B in order to describe the forming of the second buffer layer including the contact holes on the first buffer layer.

As illustrated in FIG. 5B, after the second buffer layer 530 is formed on the first buffer layer 520, the second buffer layer 530 is patterned to include contact holes CH on the plurality of buffer segments 521, 522 and 523 of the first buffer layer 520. In doing so, the second buffer layer 530 may be patterned to include contact holes CH with two on each of the plurality of buffer segments 521, 522 and 523 of the first buffer layer 520, as illustrated in FIG. 5B. Each of the contact holes CH of the second buffer layer 530 is formed between two adjacent segments among the plurality of buffer segments 531, 532, 533, 534, 535, 536 and 537 of the second buffer layer 530.

Subsequently, a third buffer layer is formed on the second buffer layer (S42). The third buffer layer is connected to the buffer segments of the first buffer layer via the contact holes of the second buffer layer. Reference is made to FIG. 5C in order to describe the forming of the third buffer layer on the second buffer layer via which the third buffer layer is connected to the buffer segments of the first buffer layer.

As illustrated in FIG. 5C, after the third buffer layer 540 is formed on the second buffer layer 530, the third buffer layer 540 is patterned to include a plurality of buffer segments 541, 542, 543 and 544 spaced apart from one another on the plurality of buffer segments 521, 522 and 523 of the first buffer layer 520.

The present disclosure has been described in more detail with reference to the exemplary embodiments, but the present disclosure is not limited to the exemplary embodiments. It will be apparent to those skilled in the art that various modifications can be made without departing from the technical sprit of the disclosure. Accordingly, the exemplary embodiments disclosed in the present disclosure are used not to limit but to describe the technical spirit of the present disclosure and the technical spirit of the present disclosure is not limited to the exemplary embodiments. Therefore, the exemplary embodiments described above are considered in all respects to be illustrative and not restrictive. The protection scope of the present disclosure must be interpreted by the appended claims and it should be interpreted that all technical spirits within a scope equivalent thereto are included in the appended claims of the present disclosure.

What is claimed is:

1. A flexible substrate, comprising:
   a substrate;
   a first buffer layer on the substrate, the first buffer layer having a plurality of first buffer segments;
   a second buffer layer on the first buffer layer, the second buffer layer having a plurality of second buffer segments; and
   a third buffer layer on the second buffer layer, wherein the third buffer layer is connected to the first buffer layer via a contact hole between two adjacent second buffer segments,
   wherein the first buffer layer and the third buffer layer are silicon nitride ($SiN_x$) layers, and the second buffer layer is a silicon oxide ($SiO_x$) layer.

2. The flexible substrate according to claim 1, wherein the third buffer layer has a plurality of third buffer segments spaced apart from one another.

3. The flexible substrate according to claim 2, wherein each of the second buffer segments is isolated by the first buffer segment and third buffer segment connected via the contact hole between each of the second buffer segments.

4. The flexible substrate according to claim 2, further comprising a continuous fourth buffer layer covering the plurality of third buffer segments, the fourth buffer layer being formed from materials used to form the second buffer layer and connected to the second buffer layer via a contact hole between two adjacent third buffer segments.

5. The flexible substrate according to claim 4, wherein the fourth buffer layer is a silicon oxide ($SiO_x$) layer.

6. The flexible substrate according to claim 1, further comprising a lower buffer layer interposed between the substrate and the first buffer layer, wherein the lower buffer layer is formed from materials used to form the second buffer layer.

7. A flexible substrate, comprising:
   a substrate;
   a plurality of first buffer layers on the substrate; and
   a plurality of second buffer layers on the substrate, each of the second buffer layers interposed between two adjacent first buffer layers, wherein at least one of the first buffer layer is patterned to have a plurality of buffer segments, and wherein at least one of the buffer segments in one of the first buffer layers is connected to the plurality of the buffer segments in the adjacent first buffer layer,
   wherein each of the first buffer layers is a silicon nitride (SiNx) layer, and each of the second buffer layers is a silicon oxide (SiOx) layer.

8. The flexible substrate according to claim 7, wherein at least one of the second buffer layers is patterned to have a plurality of buffer segments, each buffer segment of the plurality of buffer segments connected to an adjacent second buffer layer.

9. The flexible substrate according to claim 8, wherein the plurality of buffer segments in one of the second buffer layers includes a first group of buffer segments connected to the adjacent second buffer layer positioned above the respective buffer segments and a second group of buffer segments connected to the adjacent second buffer layer positioned below the respective buffer segments.

* * * * *